(12) United States Patent
Guo et al.

(10) Patent No.: US 11,572,619 B2
(45) Date of Patent: Feb. 7, 2023

(54) METHOD OF THIN FILM DEPOSITION IN TRENCHES

(71) Applicant: Applied Materials, Inc., Santa Clara, CA (US)

(72) Inventors: Jinrui Guo, Santa Clara, CA (US); Ludovic Godet, Sunnyvale, CA (US); Rutger Meyer Timmerman Thijssen, San Jose, CA (US); Yongan Xu, Santa Clara, CA (US); Jhenghan Yang, San Jose, CA (US); Chien-An Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 325 days.

(21) Appl. No.: 16/795,232

(22) Filed: Feb. 19, 2020

(65) Prior Publication Data
US 2020/0332414 A1    Oct. 22, 2020

Related U.S. Application Data

(60) Provisional application No. 62/865,001, filed on Jun. 21, 2019, provisional application No. 62/834,832, filed on Apr. 16, 2019.

(51) Int. Cl.
  *C23C 16/04* (2006.01)
  *C23C 16/56* (2006.01)
  *C23C 16/30* (2006.01)

(52) U.S. Cl.
  CPC .......... *C23C 16/042* (2013.01); *C23C 16/308* (2013.01); *C23C 16/56* (2013.01)

(58) Field of Classification Search
  None
  See application file for complete search history.

(56) References Cited

U.S. PATENT DOCUMENTS

| 6,703,918 B1 | 3/2004 | Kita |
| 8,243,131 B2 | 8/2012 | Choi et al. |

(Continued)

FOREIGN PATENT DOCUMENTS

| JP | H063822 A | * | 1/1994 | ................ C08F 2/44 |
| JP | 2009276665 |   | * 11/2009 | ................ G02B 5/30 |

(Continued)

OTHER PUBLICATIONS

Jahnel et al. Thin Film Organic Photodiodes on Complementary Metal-Oxide-Semiconductor (CMOS) Materials Structured via Orthogonal Photolithography for Sensor Applications. The 23rd International Display Workshops in conjunction with Asia Display. Dec. 2016, pp. 521-524. figure 1.

(Continued)

*Primary Examiner* — Mandy C Louie
(74) *Attorney, Agent, or Firm* — Patterson + Sheridan, LLP (57) ABSTRACT

Embodiments of the present disclosure generally relate to processing a workpiece containing a substrate during deposition, etching, and/or curing processes with a mask to have localized deposition on the workpiece. A mask is placed on a first layer of a workpiece, which protects a plurality of trenches from deposition of a second layer. In some embodiments, the mask is placed before deposition of the second layer. In other embodiments, the second layer is cured before the mask is deposited. In other embodiments, the second layer is etched after the mask is deposited. Methods disclosed herein allow the deposition of a second layer in some of the trenches present in the workpiece, while at least partially preventing deposition of the second layer in other trenches present in the workpiece.

19 Claims, 9 Drawing Sheets

(56) References Cited

U.S. PATENT DOCUMENTS

| | | |
|---|---|---|
| 9,245,166 B2 | 1/2016 | Huang et al. |
| 9,495,575 B2 | 11/2016 | Kim et al. |
| 2009/0104790 A1 | 4/2009 | Liang |
| 2010/0044887 A1* | 2/2010 | Fukuda .............. H01L 23/5389 257/E23.116 |
| 2010/0143609 A1 | 6/2010 | Fukazawa et al. |
| 2012/0007035 A1 | 1/2012 | Jo et al. |
| 2012/0075196 A1 | 3/2012 | Ashbrook et al. |
| 2014/0218311 A1 | 8/2014 | Huang et al. |
| 2014/0279528 A1 | 9/2014 | Slaby et al. |
| 2015/0221541 A1 | 8/2015 | Nemani et al. |
| 2016/0034742 A1* | 2/2016 | Kim ....................... G06F 21/35 382/124 |
| 2016/0300709 A1 | 10/2016 | Posseme et al. |
| 2017/0076968 A1 | 3/2017 | Wang et al. |
| 2017/0084425 A1 | 3/2017 | Uziel et al. |
| 2018/0261516 A1 | 9/2018 | Lin et al. |
| 2018/0261686 A1 | 9/2018 | Lin et al. |
| 2018/0329189 A1 | 11/2018 | Banna et al. |
| 2018/0339314 A1 | 11/2018 | Bhoyar et al. |
| 2018/0351164 A1 | 12/2018 | Hellmich et al. |
| 2018/0358229 A1 | 12/2018 | Koshizawa et al. |
| 2019/0019690 A1 | 1/2019 | Choi et al. |
| 2019/0032194 A2 | 1/2019 | Dieguez-Campo et al. |
| 2019/0079388 A1 | 3/2019 | Fender et al. |
| 2019/0088543 A1 | 3/2019 | Lin et al. |
| 2019/0130731 A1 | 5/2019 | Hassan et al. |
| 2019/0287808 A1 | 9/2019 | Goradia et al. |
| 2019/0311900 A1 | 10/2019 | Pandit et al. |
| 2019/0311909 A1 | 10/2019 | Bajaj et al. |
| 2019/0382879 A1 | 12/2019 | Jindal et al. |
| 2020/0027767 A1 | 1/2020 | Zang et al. |
| 2021/0180183 A1 | 6/2021 | Guo et al. |

FOREIGN PATENT DOCUMENTS

| | | |
|---|---|---|
| KR | 100670375 B1 | 1/2007 |
| KR | 20140118372 A | 10/2014 |

OTHER PUBLICATIONS

International Search Report and Written Opinion dated Jun. 12, 2020 for Application No. PCT/US2020/018798.

* cited by examiner

METHOD OF THIN FILM DEPOSITION IN TRENCHES

CROSS-REFERENCE TO RELATED APPLICATIONS

This application claims benefit to U.S. Appl. No. 62/865,001, filed on Jun. 21, 2019, and U.S. Appl. No. 62/834,832, filed on Apr. 16, 2019, which are herein incorporated by reference in their entirety.

BACKGROUND

Field

Embodiments of the present disclosure generally relate to a method, and, more specifically, to a method of thin film deposition in trenches.

Description of the Related Art

In optical devices, such as virtual or augmented reality sets, a waveguide combiner is often used to couple a virtual image, transport light inside a glass substrate through total internal reflection, and then couple the image when reaching the position of viewer's eye. For light coupling and decoupling, slanted features and trenches in the waveguide combiner are usually applied as gratings for light diffraction. The orientation of lines (fins) controls the light propagation direction, whereas the tilted angle controls the efficiency of desired order(s) of diffraction.

Selective deposition in trenches has important industrial applications for optical devices. Precise control of the material properties of the deposited films, such as the refractive index, is necessary to ensure proper functioning of these devices. In addition, film growth without unwanted voids or holes is needed to ensure proper diffraction, reflection, and refraction of incident light on the optical structures. Thus, even film growth is required, along with selectivity, to ensure that the correct portions of the structures receive the films with desired material properties.

Traditional selective deposition processes often include chemical mechanical polishing (CMP) techniques to remove excess film growth and ensure that film growth occurs only in desired portions of the workpiece. However, CMP techniques are unable to remove film growth in trenches, as CMP techniques are surface level techniques. Also, the harsh mechanical condition during CMP can damage the underlying structures on the workpiece.

Therefore, improved methods for selectively depositing layers on a workpiece with trenches are needed.

SUMMARY

In one or more embodiments, a method for processing a workpiece is provided, including applying a mask on a first layer disposed on a substrate, wherein the mask covers a first portion of the first layer and leaves exposed a second portion of the first layer, depositing a second layer on the second portion of the first layer, removing the mask from the first portion of the first layer, wherein the first portion of the first layer is exposed and the second portion of the first layer contains the second layer deposited thereon, and exposing the second layer to a curing process.

In other embodiments, a method for processing a workpiece is provided, including depositing a second layer including an uncured composition on a first layer disposed on a substrate, applying a mask on the second layer, wherein the mask covers a first portion of the second layer and leaves exposed a second portion of the second layer, exposing the mask and the second portion of the second layer to a curing process, wherein the mask shields the first portion of the second layer from the curing process while the second portion of the second layer is at least partially cured during the curing process, and wherein subsequent to the curing process, the first portion of the second layer includes the uncured composition and the second portion of the second layer includes a cured composition formed from the uncured composition, and removing the mask and the first portion of the second layer including the uncured composition.

In other embodiments, a method for processing a workpiece is provided, including depositing a second layer including an uncured composition on a first layer disposed on a substrate, applying a mask on the second layer, wherein the mask covers a first portion of the second layer and leaves exposed a second portion of the second layer, exposing the mask and the second portion of the second layer to an etching process, wherein the mask shields the first portion of the second layer from the etching process while the second portion of the second layer is at least partially etched during the etching process, and removing the mask.

The methods disclosed allow for selective deposition in trenches without requiring a CMP process. The selective deposition described herein allows for deposition in some trenches, and prevents deposition in other trenches.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to processing a workpiece containing a plurality of features and trenches. A combination of masks, curing, and etches allows for selective deposition on various portions of the workpiece. Films are selectively deposited on only certain parts of a workpiece, filling some trenches, and not filling others. The embodiments disclosed herein are especially useful for, but not limited to, selectively depositing film material in certain trenches, while preventing deposition in other trenches.

As used herein, the term "about" refers to a +/−10% variation from the nominal value. It is to be understood that such a variation can be included in any value provided herein.

Mask Deposition Followed by Second Layer Deposition

Figure 1A:
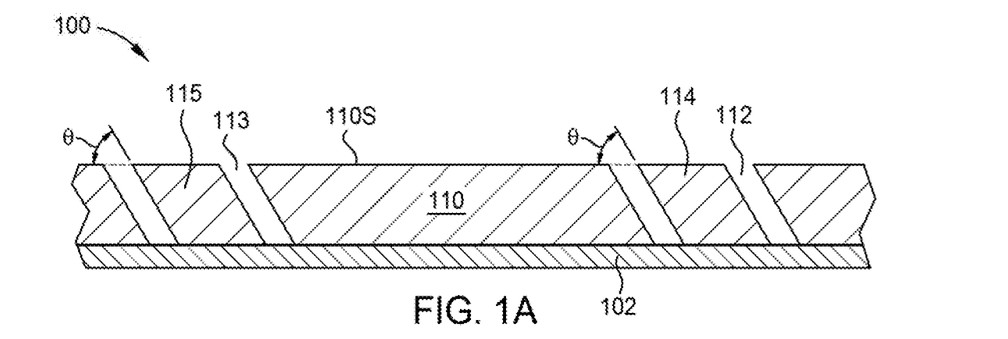
FIGS. 1A-1E illustrate schematic views of a workpiece being processed at different intervals during a process that includes depositing with a mask, according to one or more embodiments described and discussed herein.

FIG. 1A depicts a workpiece 100 which includes a first layer 110 disposed on a substrate 102. The first layer 110 can include monocrystalline silicon (Si), polysilicon, amorphous silicon, silicon nitride (SiN), silicon oxide (SiO), silicon oxynitride (SiON), fused silica, one or more metal oxides, doped derivatives thereof, or any combination thereof. The first layer 110 can include a plurality of structures 114, 115 formed therein. The plurality of structures 114, 115 can include vertical fins, slanted fins, or pillars (e.g., nanopillars).

A plurality of trenches 112, 113 are formed or otherwise defined within the first layer 110 and between the structures 114, 115. Trenches 112, 113 include one or more passageways, vias, spaces, gaps, voids, or holes adjacent any of the structures 114, 115. The trenches 112, 113 can be at an angle θ to the surface of the first layer 110, such as from about 15° to about 75°. In some embodiments, the angle θ can be from about 15°, about 20°, about 25°, or about 30° to about 45°, about 55°, about 65°, or about 75°. Each trench 112, 113 can have the same or different spacing between adjacent trenches. Each trench 112, 113 can have the same or different widths of the other trenches. Each trench 112, 113 can have the same or different depths of the other trenches. Each trench 112, 113 can have the same or different angle θ of the other spaces. Trench 112, 113 depths can vary from about 100 nm to about 1 um, trench widths and trench to trench spacing are from about 50 nm to about 600 nm.

The workpiece 100 has a second plurality of structures 114 and a second plurality of trenches 112 disposed in the second portion 118 of the first layer 110, the structures separated by the trenches. The first plurality of trenches 113 has at least one trench that makes an angle θ of about 15° to about 75° with respect to the surface 110S of the first layer 110, according to one or more embodiments described and discussed herein. The second plurality of trenches 112 has at least one trench that makes an angle θ of about 15° to about 75° with respect to the surface of the first layer 110, according to one or more embodiments described and discussed herein. The angles 8 of the first trench 113 and the second trench 12 can be the same or different from one another.

In some embodiments, the first layer 110 is a surface of the substrate 102, and the substrate 102 can include one or more structures 114, 115. The substrate 102 can include a wafer or panel substrate capable of having material, layers, films, and/or the like deposited thereon. The substrate 102 can include silicon (doped or undoped), crystalline silicon, silicon oxide, doped or undoped polysilicon, or the like, a germanium (Ge) substrate, a silicon germanium (SiGe) substrate, a Group III-V compound substrate, such as a gallium arsenide (GaAs) substrate, a silicon carbide (SiC) substrate, a patterned or non-patterned semiconductor-on-insulator (SOI) substrate, a carbon-doped oxide, a silicon nitride, a solar array, solar panel, a light emitting diode (LED) substrate, or any other materials such as metals, metal alloys, and other conductive materials. In some examples, the substrate 102 can be disposed on a substrate holder or a substrate pedestal, a chucking plate, or the like. The substrate 102 can include a plurality of layers or films, such as a semi-insulating material and a semiconducting material, where the semi-insulating material has a higher resistivity than the semiconducting material. The substrate 102 is not limited to any particular size or shape (e.g., round, rectangular, or square). In some examples, the substrate 102 is round and has a diameter of about 100 mm to about 450 mm.

Figure 1B:
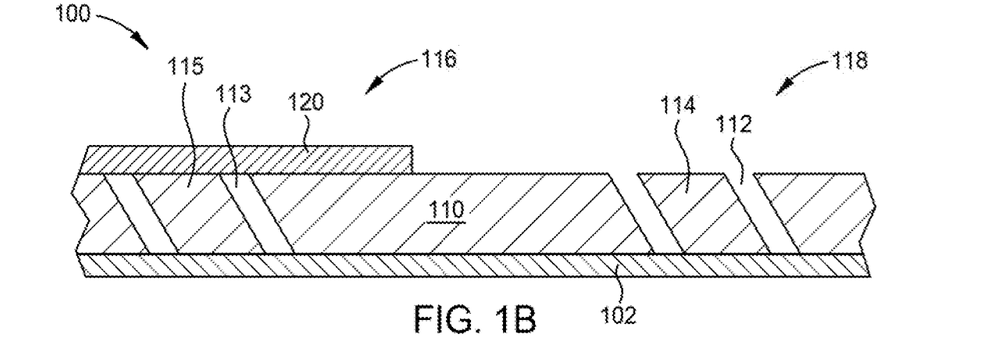
Figure 1C:
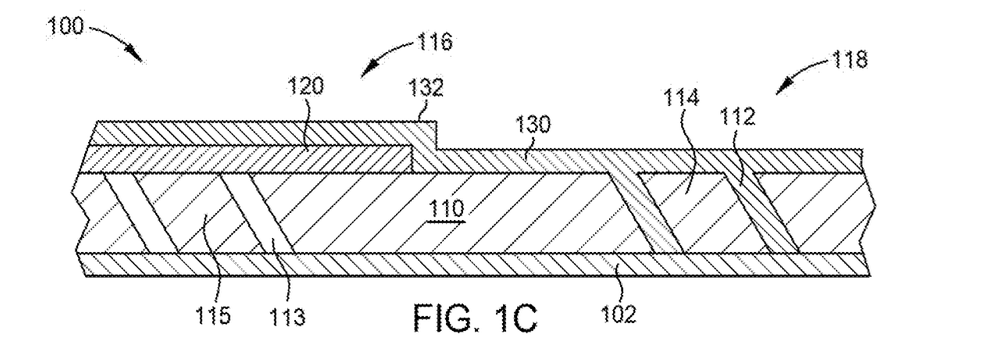
Figure 1D:
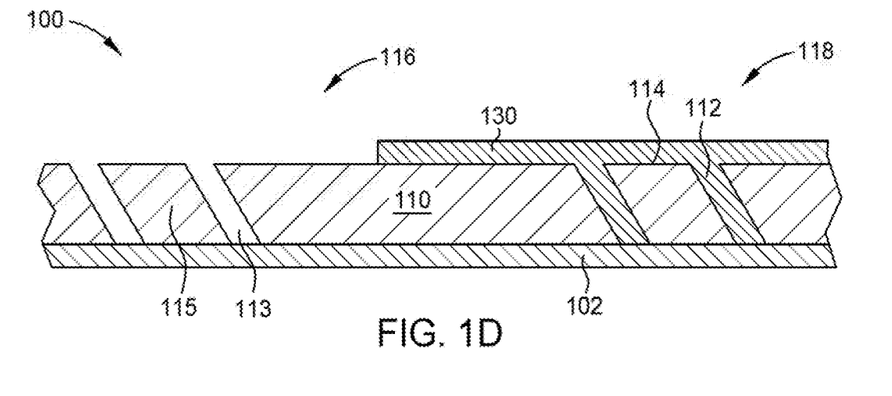
Figure 1E:
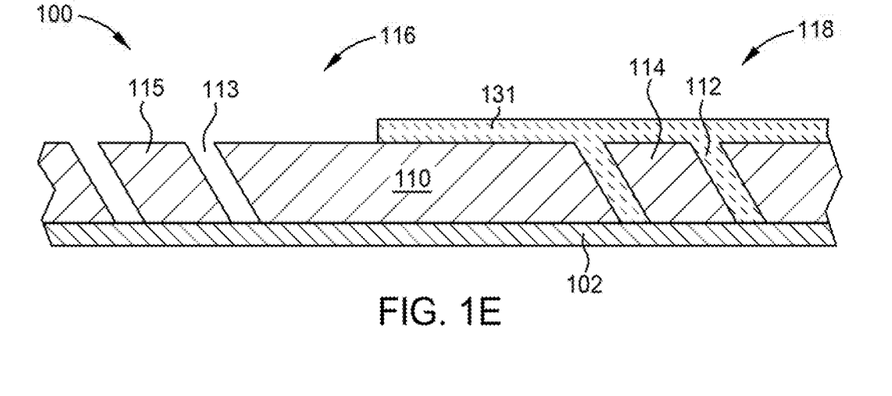
Figure 2:
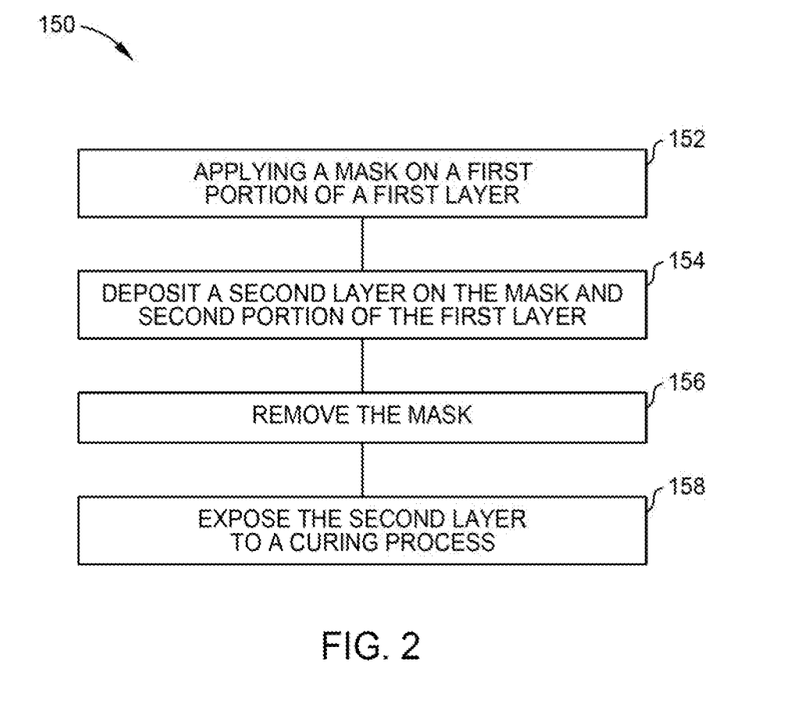
FIG. 2 is a flow diagram of method operations for depositing a second layer on a workpiece using a mask, according to one or more embodiments described and discussed herein.

FIG. 2 is a flow diagram of method operations 150 for depositing a second layer 130 on the first layer 110 using a mask 120, according to one or more embodiments described and discussed herein. Although the method 150 operations are described in conjunction with FIGS. 1A-1E and 2, persons skilled in the art will understand that any system configured to perform the method operations, in any order, falls within the scope of the embodiments described herein.

The method 150 begins at operation 152, where a mask 120 is applied, placed, deposited, formed, or otherwise disposed on the first layer 110, as depicted in FIG. 1B. The mask 120 has a predetermined pattern that can be transposed to the underlying layer, such as the first layer 110. The mask 120 covers a first portion 116 of the first layer 110 and leaves exposed a second portion 118 of the first layer. The mask 120 can be or include a contact mask, a proximity mask, a projection mask, or dicing tape. The mask 120 can be separate from the processing chamber, or inside the processing chamber as a movable part. In some examples, the mask 120 can be or include a photo mask in a UV cure process and can be incorporated into a UV chamber or a photolithography tool.

The mask 120 has a thickness from about 10 μm to about 1 mm, such as from about 100 μm to about 500 μm. The thickness of the mask 120 can be designed to reduce the shadowing effect, which can produce non-uniform deposition close to the edge of the mask. For example, the mask 120 has a relatively small thickness, e.g., from about 100 μm to about 150 μm, to reduce the shadowing effect.

At operation 154 of the method 150, a second layer 130 is deposited on the second portion 118 of the first layer 110, as well as the mask 120, as depicted in FIG. 1C. The second layer 130 is at least partially deposited within the second plurality of trenches 112. The mask 120 covers and can substantially or completely protect or shield the first portion 116 of the first layer 110 from the second layer 130 depositing on the first portion 116. In some examples, residual amounts of material of the second layer 130 can eventually contaminate the first portion 116 of the first layer 110. Also, depending on the composition of the second layer 130 and the specific deposition process used to deposit or otherwise form the second layer 130, the mask 120 can include a layer 132 of the same material as the second layer 130 and/or can contain various byproducts, particulates, and/or other contaminants thereon.

The second layer 130 is deposited by chemical vapor deposition (CVD), plasma-enhanced CVD (PE-CVD), sub-atmospheric CVD (SA-CVD), high density plasma CVD (HDP-CVD), flowable CVD (FCVD® processes), atomic layer deposition (ALD), furnace ALD, thermal ALD, plasma-enhanced ALD (PE-ALD), physical vapor deposition (PVD), ion beam deposition, spin-coating, or any combination thereof. The second layer 130 includes a coating material, such as spin-on-carbon, epoxy, naphthalene resin ($C_{10}H_8$), organic planarization layer (OPL), poly(methyl methacrylate) (PMMA), polysilazane, polysiloxane, photoresists, or electron-beam (e-beam) resists. The second layer 130 can also include silicon oxide (SiO), silicon oxynitride (SiON), silicon nitride (SiN), silicon carbide (SiC), silicon oxycarbide (SiOC), silicon hydroxynitride (SiOHN), amorphous silicon ($\alpha$-Si), polysilicon, silicon-containing antireflective coating (SiARC), aluminum oxide ($Al_2O_3$), carbon (C), carbon hydroxide (COH), alloys thereof, doped derivatives thereof, or any combination thereof. In one or more examples, the second layer 130 can have a refractive index (RI) of about 1.05 to about 4.50. The optical and gap fill properties of the second layer 130 can be tuned through polymer type and functional groups. For example, methyl ($CH_3$—) groups or cage-like hydrogen silsesquioxane (HSQ) groups are known to reduce the RI of the second layer 130.

A silicon precursor, such as trisilylamine (TSA) ($N(SiH_3)_3$), silanes, tetrasilane ($Si_4H_{10}$), tetraethyl orthosilicate (TEOS), tetramethoxysilane (TMOS), or octamethylcyclotetrasiloxane (OMCTS), can be used to deposit silicon-containing second layers 130, such as silicon, silicon oxide, or silicon oxynitride, during a CVD process. A silicon precursor, such as trisilylamine (TSA) and a nitrogen precursor, such as ammonia ($NH_3$), can be used to deposit a silicon oxynitride layer during a CVD process. A silicon precursor, such as polysiloxane, can be used to deposit a silicon oxide layer during a spin-on process.

The deposition of the second layer 130 can be performed at a substrate temperature or a processing chamber temperature from about 23° C. to about 400° C. For example, a CVD or ALD process can be performed at a substrate temperature or a processing chamber temperature from about 23° C. to about 100° C. A spin coating process can be performed at a substrate temperature or a processing chamber temperature at about 23° C. A wet etch can be performed after deposition of the second layer 130, in order to remove residual deposition of the second layer present under the mask 120.

At operation 156 of the method 150, the mask 120 is removed from the first portion 116 of the first layer 110. Thereafter, the first portion 116 of the first layer 110 is exposed or left bare and the second portion 118 of the first layer 110 contains the second layer 130 deposited thereon, as depicted in FIG. 1D. Various materials (e.g., the layer 132), particulate, or other contaminant contained on the mask 120 can be removed before removing the mask 120 and/or at the same time. The mask 120 and the first portion 116 of the second layer 130 are removed in the same processing step, according to one or more embodiments described and discussed herein. The mask 120 and the first portion 116 of the second layer 130 are sequentially removed in different processing steps, according to one or more embodiments described and discussed herein.

In one or more embodiments, the method 100 can include removing residual material from the first portion 116 of the first layer 110 during an etching process subsequent to removing the mask 120. The etching process can include a wet etch process and includes exposing the residual material to a solution containing hydrofluoric acid (HF), phosphoric acid ($H_3PO_4$), one or more hydroxides (e.g., sodium hydroxide (NaOH), potassium hydroxide (KOH), lithium hydroxide (LiOH), ammonium hydroxide ($NH_4OH$)), or salts thereof. A dilute hydrofluoric acid (DHF) solution having a concentration from about 50:1 to about 1,000:1 (in water) can be used during an etching process, such as for a second layer 130 including SiON. The etching process can be a dry etch process and includes exposing the residual material to a plasma containing fluorine (F), chlorine (Cl), compounds thereof, ions thereof, or any combination thereof, such as for a second layer 130 including SiON.

At operation 158 of the method 150, the second layer 130 is converted to a cured composition 131, as depicted in FIG. 1E. The curing process drives out unwanted solvents from the second layer 130, solidifies and stabilizes the second layer, and can also modify chemical and optical properties of the second layer, converting the second later to the cured composition 131. The curing process or treatment can be or include a thermal curing process, an ultraviolet (UV) curing process, a plasma-assisted treatment process, an ion beam treatment process, an electron beam (e-beam) treatment, or any combination thereof, according to some embodiments.

The curing process can be performed at a temperature from about 23° C. to about 400° C. If UV light is applied, the UV wavelength can be a broadband wavelength from about 190 nm to about 500 nm, or single wavelength excimer lasers with wavelengths of about 193 nm, 248 nm, or 365 nm. The UV curing time can vary from about 1 minute to about 10 minutes. The second layer 130 is exposed to ozone ($O_3$) during the curing process, according to one or more embodiments described and discussed herein. In some embodiments, the curing process can include exposing the second layer 130 to one or more processing gases or compounds during the treatment or process, such as argon (Ar), helium (He), oxygen ($O_2$), ozone ($O_3$), hydrogen gas ($H_2$), nitrogen gas ($N_2$), ammonia, water, ethylene ($C_2H_4$), acetylene ($C_2H_2$), or any combination thereof. The curing process is used to modify the second layer 130 film composition and stress as required for a given application. Optical properties of the second layer 130 can be tuned by material design (choice of polymer and functional groups, binder, and solvent), and baking condition (e.g., step-wise baking) to control crosslinking, solvent evaporation, and formation of nanoporosity. In addition, the cured composition 131 is easier or more difficult to remove from the workpiece 100 than the unmodified second layer 130.

For example, a second layer 130 including FCVD-deposited SiONH can be cured into a cured composition 131 including SiO. In an additional example, a second layer 130 including a spin coating-deposited polymer and solvent layer can be cured into a cured composition 131 including CHO, wherein the cured composition includes a crosslinked polymer.

In one or more embodiments, the second layer 130 is deposited using FCVD using $TSA/NH_3/O_2$ precursors at a temperature from about 23° C. to about 100° C., the second layer is cured using a baking process at temperatures from about 23° C. to about 400° C. while ozone is applied, and a wet etch including DHF is applied.

In other embodiments, the second layer 130 is deposited using spin coating, the second layer includes an organic planarization layer (OPL) including a polymer including C and H, the second layer is cured using a baking process at temperatures from about 250° C. to about 400° C., and a wet etch including a sulfuric peroxide mix (SPM) is applied.

As described above, a mask is deposited on a first layer. A second layer is deposited on the workpiece, but the mask prevents deposition of the second layer in the first plurality of trenches disposed underneath the mask. The mask is removed, and thus the second layer is grown such that material of the second layer is present in the second plurality of trenches, but not the first plurality of trenches.

The mask protects the first plurality of trenches from being filled with the second layer, while still allowing the second plurality of trenches to be filled with the second layer. The method as described above works well for films that do not require curing in order to be removed from the workpiece.

Second Layer Deposition Followed by Mask Deposition

Figure 3A:
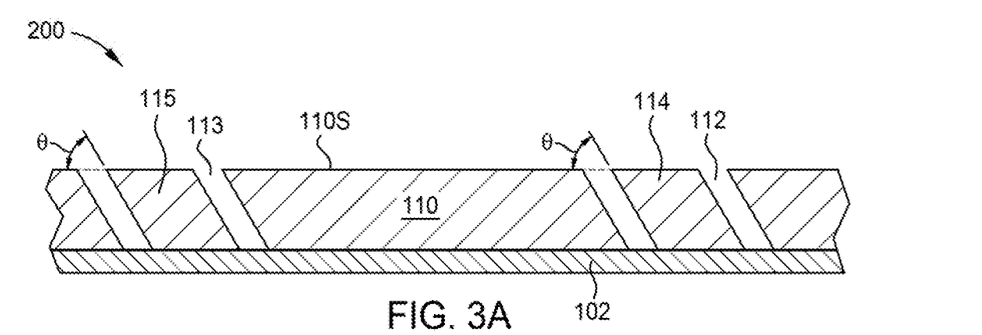
FIGS. 3A-3E illustrate schematic views of a workpiece being processed at different intervals during a process that includes curing with a mask, according to one or more embodiments described and discussed herein.

FIG. 3A depicts a workpiece 200, which includes the first layer 110 disposed on the substrate 102 and containing the plurality of trenches 112, 113 and the one or more structures 114, 115 as previously discussed for the workpiece 100 in FIG. 1A.

Figure 3B:
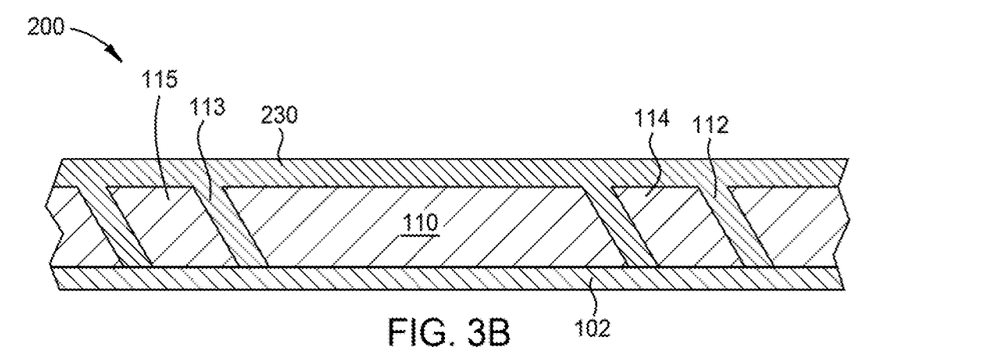
Figure 3C:
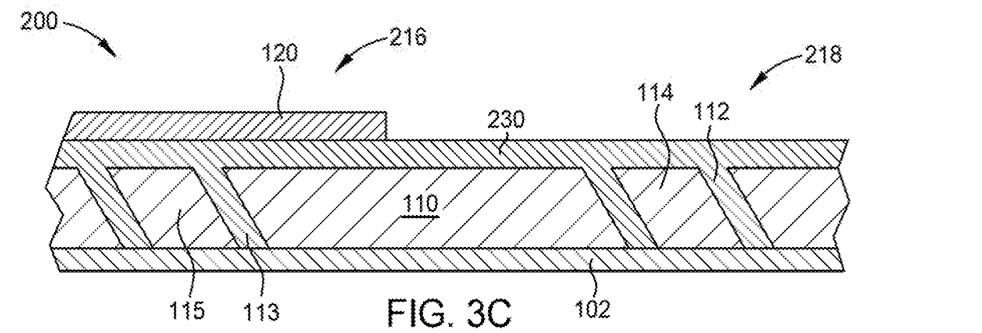
Figure 3D:
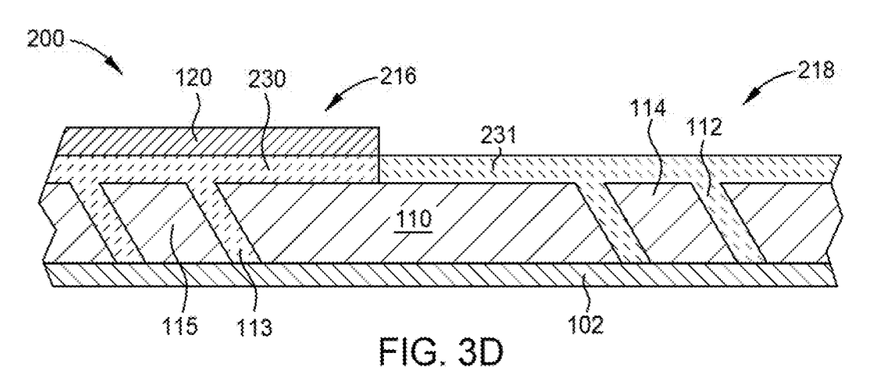
Figure 3E:
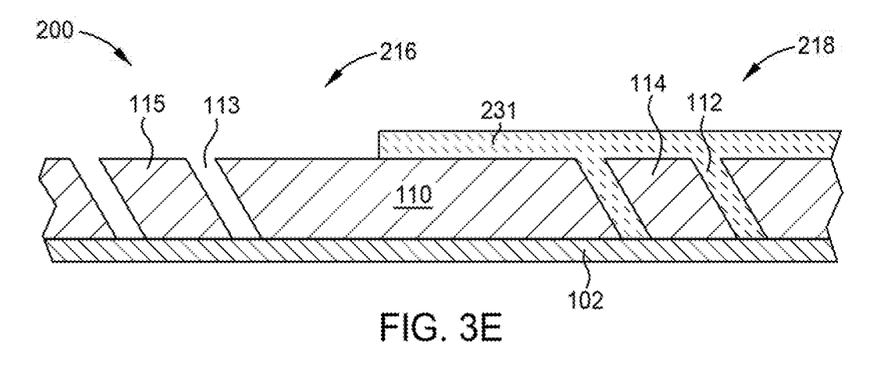
Figure 4:
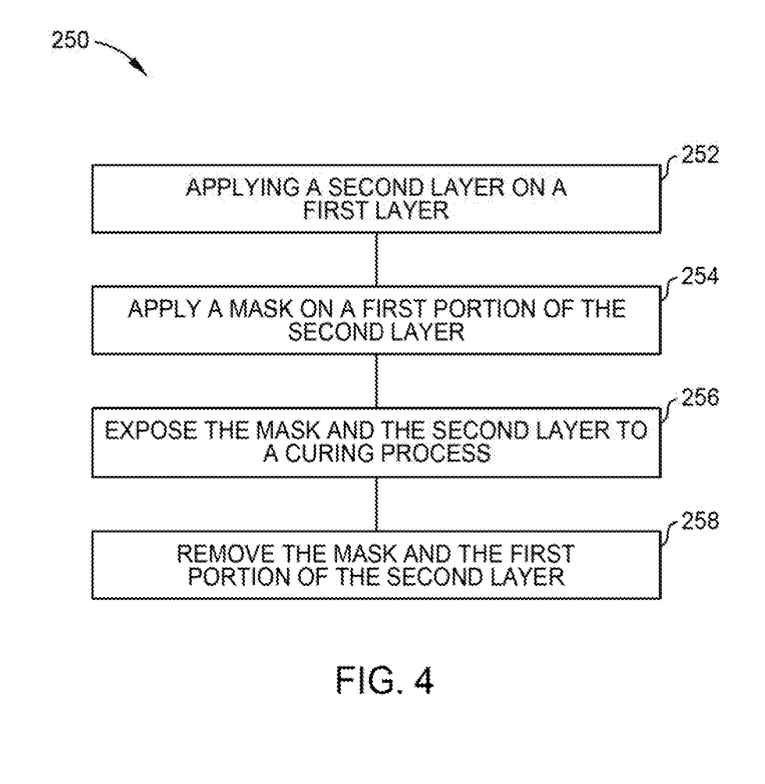
FIG. 4 is a flow diagram of method operations for depositing a second layer on a workpiece using a curing process and a mask, according to one or more embodiments described and discussed herein.

FIG. 4 is a flow diagram of method 250 operations for depositing a second layer 230 on the workpiece 200, including curing and using a mask 120, according to one or more embodiments described and discussed herein. Although the method 250 operations are described in conjunction with FIGS. 3A-3E and 4, persons skilled in the art will understand that any system configured to perform the method operations, in any order, falls within the scope of the embodiments described herein.

The method 250 begins at operation 252, where a second layer 230 containing an uncured composition is deposited on the first layer 110, as depicted in FIG. 3B. The second layer 230 fills the first plurality of trenches 113 and the second plurality of trenches 112. The second layer 230 also extends along and covers the first layer 110. The second layer 230 is deposited by any of the methods disclosed in the discussion of the deposition of second layer 130 FIG. 1B above. The materials of the second layer 230 is similar that of the second layer 130 described above. The deposition of the second layer 230 can be performed at a substrate temperature or a processing chamber temperature similar to that of second layer 130 described above.

At operation 254 of the method 250, the mask 120 is applied, placed, deposited, formed, or otherwise disposed on the second layer 230, as depicted in FIG. 3C. The content of the mask 120 and the application of the mask is similar to that of operation 152 described above.

At operation 256 of the method 250, the workpiece 200, including the mask 120 and a second portion 218 of the second layer 230, is exposed to a curing process, as depicted in FIG. 3D. The mask 120 shields or otherwise protects a first portion 216 of the second layer 230 from the curing process while the second portion 218 of the second layer 230 is at least partially cured, substantially cured, or completely cured during the curing process. Subsequent to the curing process, the first portion 216 of the second layer 230 contains the uncured composition. The second portion 218 of the second layer 230 contains a cured composition 231 formed from the uncured composition during the curing process. The curing process is similar to that of the operation 158 described above.

At operation 258 of the method 250, the mask 120 and the first portion 216 of the second layer 230 containing the uncured composition are removed from the workpiece 200, as depicted in FIG. 3E. The mask 120 can be removed before removing the first portion 216 of the second layer 230. The mask 120 and the first portion 216 of the second layer 230 can removed during the same process. The first portion 216 of the layer can be removed by an etching process. The etching process can include a wet etch process and includes exposing the uncured material to a solution containing hydrofluoric acid, phosphoric acid, one or more hydroxides (e.g., sodium hydroxide, potassium hydroxide, lithium hydroxide, ammonium hydroxide), or salts thereof. In one or more examples, a DHF solution having a concentration from about 50:1 to about 1,000:1 (in water) is used during an etching process. The etching process can include a dry etch process and includes exposing the uncured material to plasma containing oxygen, fluorine, chlorine, compounds thereof, ions thereof, or any combination thereof.

In other embodiments, the second layer 330 is deposited using FCVD using TSA/NH$_3$/O$_2$ precursors at a temperature from about 23° C. to about 100° C., the second layer is cured using a baking process at temperatures from about 0° C. to about 400° C. while ultraviolet (UV) light is at a wavelength of about 193 nm to about 500 nm for about 1 minute to about 10 minutes, and a dry or wet etch including DHF is applied.

In other embodiments, the second layer 330 is deposited using FCVD using OMCTS/TMOS/O$_2$ precursors at a temperature from about 23° C. to about 100° C., the second layer is cured using a baking process at temperatures from about 0° C. to about 400° C. while ultraviolet (UV) light is applied at a wavelength of about 193 nm to about 500 nm for about 1 minute to about 10 minutes, and a dry etch including oxygen plasma is performed.

As described above, a second layer is deposited on the first layer, filling both the first plurality of trenches and the second plurality of trenches. A mask is placed over the first portion of the second layer, and the mask protects the first layer from the curing process. The curing process converts the exposed second portion of the second layer into a cured composition. When the mask is removed, the first portion of the second layer is removed along with the mask. The remaining cured composition fills the second plurality of trenches, but the first plurality of trenches is empty.

The mask protects the first plurality of trenches from being cured with the second layer, while still allowing the second plurality of trenches to be filled with the cured second layer. The method as described above works well for films that require curing after deposition.

Second Layer Deposition Followed by Etching Process

Figure 5A:
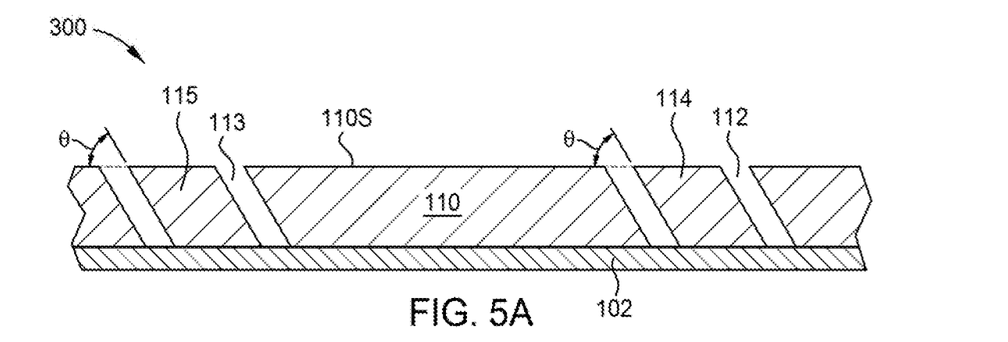
FIGS. 5A-5F illustrate schematic views of a workpiece being processed at different intervals during a process that includes etching with a mask, according to one or more embodiments described and discussed herein.

FIG. 5A depicts a workpiece 300, which includes a first layer 110 disposed on the substrate 102 and containing the plurality of trenches 112, 113 and the plurality of structures 114, 115 as previously discussed for the workpiece 100 in FIG. 1A.

Figure 5B:
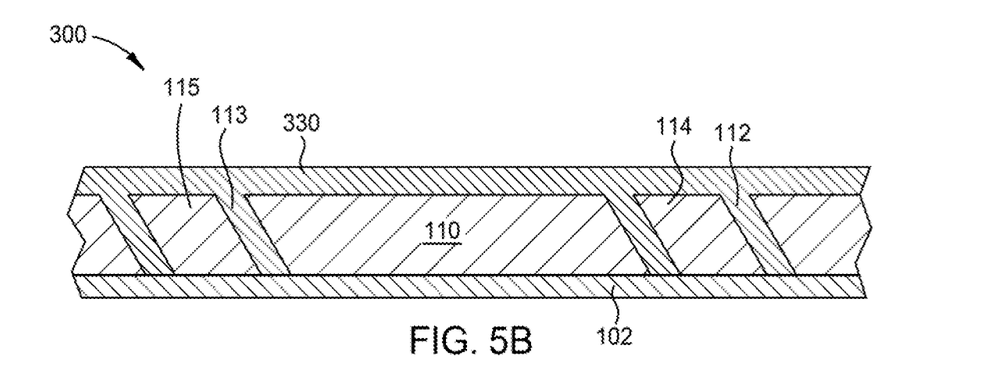
Figure 5C:
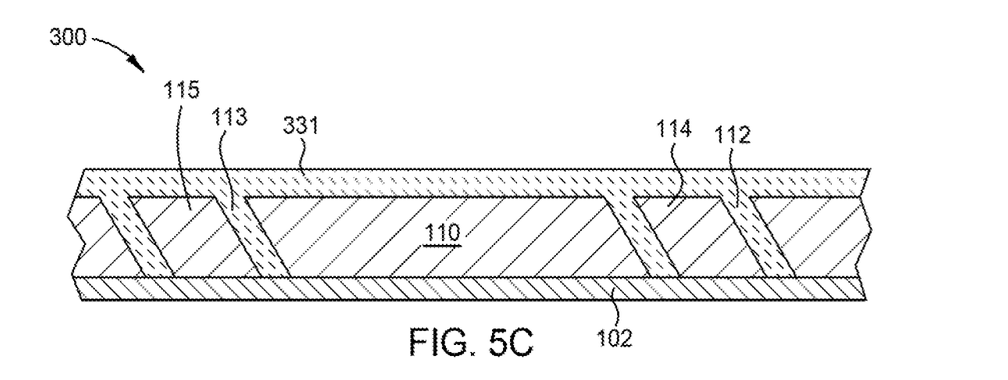
Figure 5D:
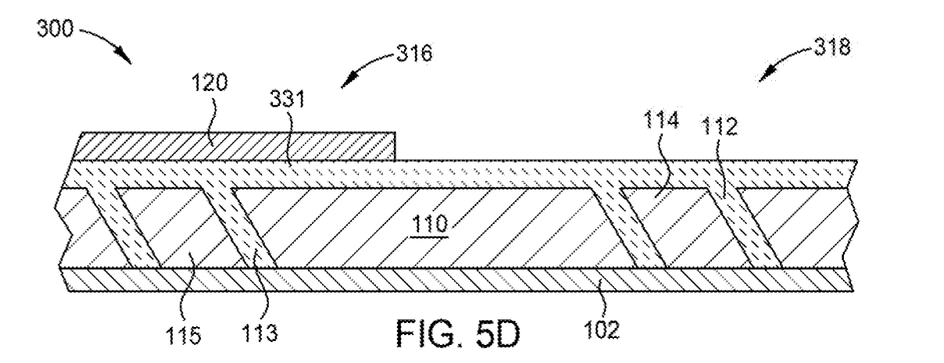
Figure 5E:
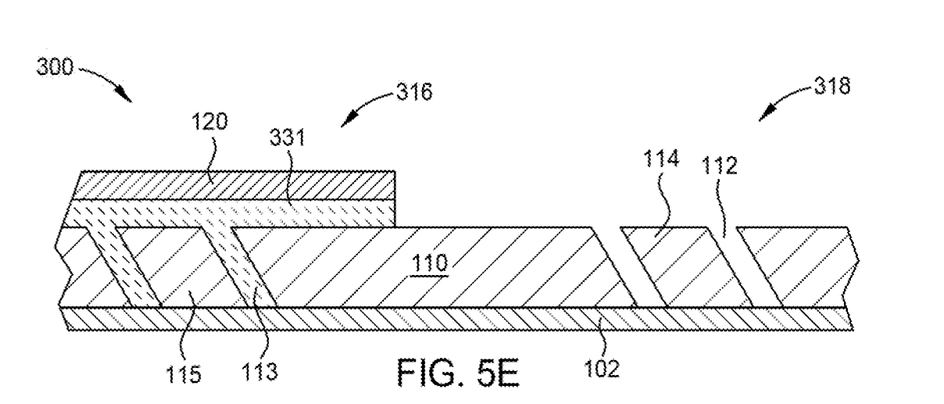
Figure 5F:
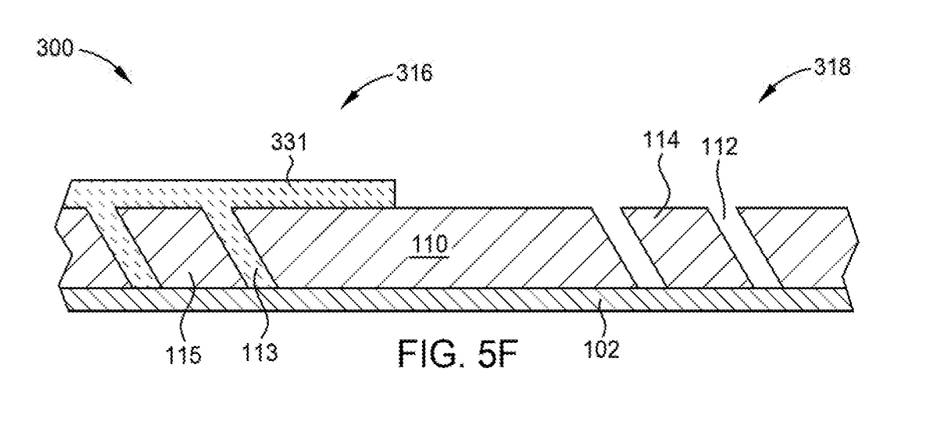
Figure 6:
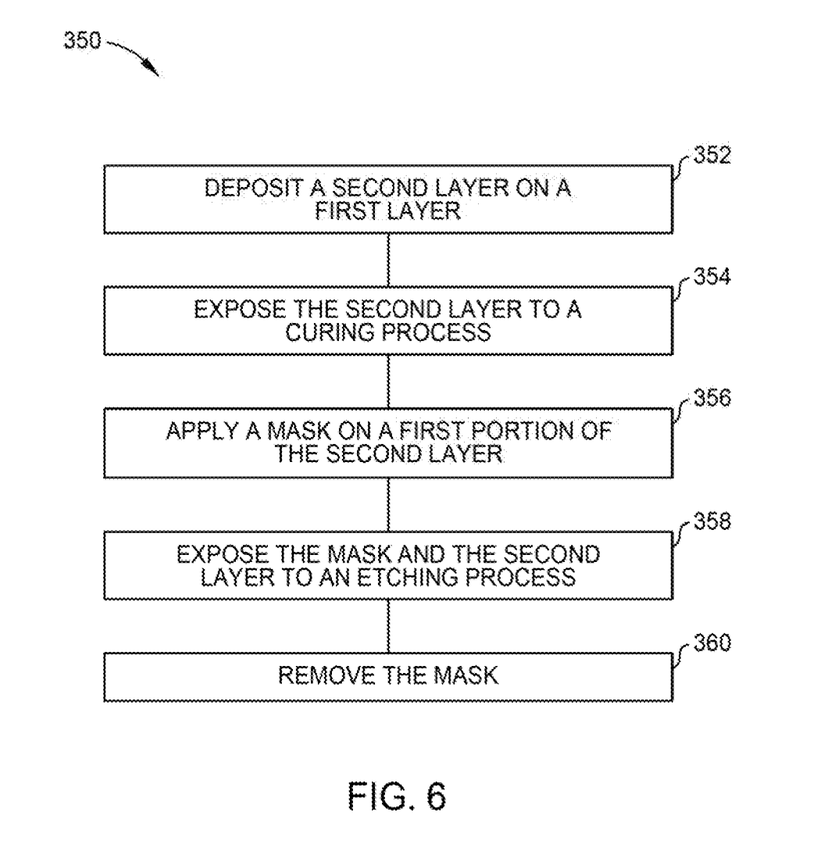
FIG. 6 is a flow diagram of method operations for depositing a second layer on a workpiece using a mask and an etching process, according to one or more embodiments described and discussed herein.

FIG. 6 is a flow diagram of method 350 operations for depositing a second layer 330 on the workpiece 300, including using the mask 120 and an etching process, according to one or more embodiments described and discussed herein. Although the method 350 operations are described in conjunction with FIGS. 5A-5F and 6, persons skilled in the art will understand that any system configured to perform the method operations, in any order, falls within the scope of the embodiments described herein.

The method 350 begins at operation 352, where a second layer 330 containing an uncured composition is deposited, formed, placed, or otherwise disposed on the first layer 110, as depicted in FIG. 5B. The second layer 330 fills the first plurality of trenches 113 and the second plurality of trenches 112. The second layer 330 also extends along and covers the first layer 110. The second layer 330 is deposited by any of the methods disclosed in the discussion of FIG. 1B above. The materials of the second layer 330 is similar that of the second layer 130 described above. The deposition of the second layer 330 can be performed at a substrate temperature or a processing chamber temperature similar to that of second layer 130 described above.

At optional operation 354 of the method 350, the second layer 330 is exposed to a curing process, converting the second layer to a modified second layer 331, as depicted in FIG. 5C. The curing process is similar to that described in operation 158 as described above. Although the following operations refer to the modified second layer 331, it is to be understood that the same process can be applied to the second layer 330 as deposited, without the curing process described above.

At operation 356 of the method 350, the mask 120 is applied, placed, deposited, formed, or otherwise disposed on the second layer 330, as depicted in FIG. 5D. The deposition of the mask 120 is similar to that described in operation 152 as described above.

At operation 358 of the method 350, the workpiece 300, including the mask 120 and a second portion 318 of the modified second layer 331, is exposed to an etching process, as depicted in FIG. 5E. The mask 120 shields or otherwise protects a first portion 316 of the second layer 330 from the etching process, while the second portion 318 of the modified second layer 331 is at least partially etched away. Subsequent to the etching process, the first portion 316 of the modified second layer 331 is not completely removed. The second portion 318 of the modified second layer 331 is at least partially removed, and the modified second layer is at least partially removed from the second plurality of trenches 112.

The etching process can include a wet etch and/or a dry etch. The wet etch includes exposing the workpiece 300 to an etching chemical, which can include DHF, KOH, sulfuric peroxide mix (SPM), phosphoric acid, or any combination of the above. The dry etch includes exposing the workpiece 300 to an etching chemical, which can include fluorine-based chemicals, chlorine-based chemicals, oxygen-based chemicals, or any combination of the above. The etch can be performed at temperatures from about 23° C. to about 200° C.

The etching chemistry is based on the composition of the modified second layer 331 to be removed. For example, DHF or hydrofluorocarbons (HFC) can be used to remove the modified second layer 331 including SiO, phosphoric acid ($H_3PO_4$) can be used to remove a modified second layer including SiN, and sulfuric peroxide mix (SPM) or oxygen plasma can be used to remove a modified second layer including carbon.

At operation 360 of the method 350, the mask 120 is removed from the workpiece 300, as depicted in FIG. 5F. The mask 120 is removed similarly to the process described in operation 156 above.

In one or more embodiments, the second layer 330 is deposited using spin coating, the second layer includes diazonaphthoquinone (DNQ) and/or novolac, the second layer is cured while ultraviolet (UV) light is applied at a wavelength of about 193 nm to about 500 nm for about 1 minute to about 10 minutes, and a dry etch including oxygen plasma is applied.

In other embodiments, the second layer 330 is deposited using spin coating, the second layer includes polysiloxane or polysilazane, the second layer is cured using a baking process at temperatures from about 0° C. to about 400° C. while ultraviolet (UV) light is applied at a wavelength of about 193 nm to about 500 nm for about 1 minute to about 10 minutes, and a dry or wet etch is performed.

In other embodiments, the second layer 330 is deposited using spin coating, the second layer includes an organic planarization layer (OPL) including a polymer including C and H, the second layer is cured using a baking process at temperatures from about 250° C. to about 400° C., and a dry etch including oxygen plasma is applied.

As described above, a second layer is deposited on the first layer, filling both the first plurality of trenches and the second plurality of trenches. The second layer is exposed to a curing process, converting the second layer to a modified second layer. A mask is placed over the first portion of the second layer. The workpiece is exposed to an etching process, which removes the second portion of the modified second layer. Finally, the mask is removed. The remaining cured composition fills the first plurality of trenches, but the second plurality of trenches is empty.

The mask protects the second plurality of trenches from being filled with a cured second layer, while still allowing the first plurality of trenches to be filled with the cured second layer. The method as described above works well for films that require curing to be etched.

In one or more embodiments, the process 150 and/or 250 and/or 350 and any operations or portions thereof, can be performed in a CVD chamber, such as a thermal CVD chamber, a PE-CVD chamber, a high-density plasma CVD chamber, a low pressure CVD chamber, a reduced pressure CVD chamber, or an atmospheric pressure CVD chamber. In other embodiments, the process 150 and/or 250 and/or 250 and any operations or portions thereof, can be performed in a PVD chamber, an ALD chamber, a PE-ALD chamber, an etch chamber (thermal or plasma), an epitaxy chamber, an anneal chamber, or any other processing chamber in which temperature monitoring might be useful. Examples of the processing chamber can include CVD chambers such as AKT® PECVD chambers, PRODUCER™ chambers, Eterna FCVD® chambers, and PRECISION 5000® chambers, commercially available from Applied Materials Inc., Santa Clara, Calif.

In other embodiments, the process 150 and/or 250 and/or 350 and any operations or portions thereof, the surfaces of the workpiece 200 are exposed to a dry-clean treatment to remove oxides, carbons, particulates, and/or other contaminants. Any suitable dry-clean treatment process that removes oxides from the substrate without significantly damaging the workpiece 100, 200, 300 can be used. Suitable dry-clean treatment processes include sputter etch processes, plasma-based oxide etch processes, or combinations thereof. The dry-clean treatment can include exposing the workpiece 100, 200, 300 to an etchant and to plasma, ions, radicals, or a combination thereof. The etchant can be or include one or more oxygen, fluorine, chlorine, nitrogen, plasmas thereof, ions thereof, radicals thereof, or any combination thereof. The dry-clean treatment includes exposing the workpiece 100, 200, 300 to a fluorine plasma generated from a combination of nitrogen trifluoride ($NF_3$) and ammonia ($NH_3$). Other contemplated etch processes include $NF_3/NH_3$ inductively coupled plasma processes or $NF_3/NH_3$ capacitively coupled plasma processes.

In one or more embodiments, the dry-clean treatment is a plasma-based oxide etch process that is a remote plasma assisted dry etch process which involves the simultaneous exposure of a substrate to $NF_3$ and $NH_3$ plasma by-products.

In some examples, the plasma-based oxide etch process can include a SICONI® etch process that is commercially available from Applied Materials, Inc. of Santa Clara, Calif. The SICONI® etch process can be performed in a SICONI® Preclean chamber, commercially available from Applied Materials, Inc. of Santa Clara, Calif.

In some examples that use remote plasma, excitation of the gas species allows plasma-damage-free substrate processing. The remote plasma etch can be largely conformal and selective towards silicon oxide layers, and thus does not readily etch silicon regardless of whether the silicon is amorphous, crystalline or polycrystalline. The remote plasma process will generally produce solid by-products which grow on the surface of the workpiece 100, 200, 300 as material is removed. The solid by-products can be subsequently removed via sublimation when the temperature of the workpiece 100, 200, 300 is raised (e.g., to about 300° C.). The plasma etch process results in the removal of oxides, particulate, and other contaminants from the surface of the workpiece 100, 200, 300.

In some examples, the dry-clean treatment process can be performed to the workpiece 100, 200, 300 in a processing chamber using or fluidly couple to a remote plasma source (RPS). For example, the processing chamber can be an AKTIV Pre-Clean® chamber, commercially available from Applied Materials, Inc. of Santa Clara, Calif. In other examples, the dry-clean treatment process can be performed in an etch chamber using an inductively coupled plasma (ICP) source. For example, the etch chamber can be a Centura® Advantedge® Mesa® Etch chamber, commercially available from Applied Materials, Inc. of Santa Clara, Calif. Alternatively, the cleaning process can be performed in an etch chamber employing a radical-based chemistry. The workpiece 100, 200, 300 is exposed to the etchant during the dry-clean treatment to remove the contaminants for a period of about 20 minutes or less, for example, about 10 minutes.

In one or more examples, the chemical properties of deposited film are utilized to produce selectivity and pattern, instead of relying on photoresist/hard mask. In one or more embodiments, the mask can be a separate, removable, and/or reusable part transferring to the processing chamber with the workpiece and/or substrate, or incorporated as a hardware component in tool and/or processing chamber. In other embodiments, a binary mask can be a contact mask which is placed on the workpiece and transferred to the processing chamber together or incorporated to the processing chamber design.

Embodiments of the present disclosure further relate to any one or more of the following paragraphs 1-33:

1. A method for processing a workpiece, comprising: applying a mask on a first layer disposed on a substrate, wherein the mask covers a first portion of the first layer and leaves exposed a second portion of the first layer; depositing a second layer on the second portion of the first layer; and removing the mask from the first portion of the first layer, wherein the first portion of the first layer is exposed and the second portion of the first layer contains the second layer deposited thereon.

2. A method for processing a workpiece, comprising: depositing a second layer comprising an uncured composition on a first layer disposed on a substrate; applying a mask on the second layer, wherein the mask covers a first portion of the second layer and leaves exposed a second portion of the second layer; exposing the mask and the second portion of the second layer to a curing process, wherein the mask shields the first portion of the second layer from the curing process while the second portion of the second layer is at least partially cured during the curing process, and wherein subsequent to the curing process, the first portion of the second layer comprises the uncured composition and the second portion of the second layer comprises a cured composition formed from the uncured composition; and removing the mask and the first portion of the second layer comprising the uncured composition.

3. A method for processing a workpiece, comprising: depositing a second layer comprising an uncured composition on a first layer disposed on a substrate, wherein the first layer comprises one or more structures formed therein, and wherein the one or more structures comprise vertical fins, slanted fins, or pillars; applying a mask on the second layer, wherein the mask covers a first portion of the second layer and leaves exposed a second portion of the second layer; exposing the mask and the second portion of the second layer to a curing process, wherein the mask shields the first portion of the second layer from the curing process while the second portion of the second layer is at least partially cured during the curing process, and wherein subsequent to the curing process, the first portion of the second layer comprises the uncured composition and the second portion of the second layer comprises a cured composition formed from the uncured composition; and removing the mask and the first portion of the second layer comprising the uncured composition.

4. A method for processing a workpiece, comprising: applying a mask on a first layer disposed on a substrate, wherein the mask covers a first portion of the first layer and leaves exposed a second portion of the first layer; depositing a second layer on the second portion of the first layer; removing the mask from the first portion of the first layer, wherein the first portion of the first layer is exposed and the second portion of the first layer contains the second layer deposited thereon; and exposing the second layer to a curing process.

5. A method for processing a workpiece, comprising: depositing a second layer comprising an uncured composition on a first layer disposed on a substrate; applying a mask on the second layer, wherein the mask covers a first portion of the second layer and leaves exposed a second portion of the second layer; exposing the mask and the second portion of the second layer to a curing process, wherein the mask shields the first portion of the second layer from the curing process while the second portion of the second layer is at least partially cured during the curing process, and wherein subsequent to the curing process, the first portion of the second layer comprises the uncured composition and the second portion of the second layer comprises a cured composition formed from the uncured composition; and removing the mask and the first portion of the second layer comprising the uncured composition.

6. A method for processing a workpiece, comprising: depositing a second layer comprising an uncured composition on a first layer disposed on a substrate; applying a mask on the second layer, wherein the mask covers a first portion of the second layer and leaves exposed a second portion of the second layer; exposing the mask and the second portion of the second layer to an etching process, wherein the mask shields the first portion of the second layer from the etching process while the second portion of the second layer is at least partially etched during the etching process; and removing the mask.

7. The method according to any one of paragraphs 1-6, wherein the second portion of the first layer comprises a second plurality of trenches, and at least one of the second plurality of trenches makes an angle of about 15° to about 75° with respect to a surface of the first layer.

8. The method according to any one of paragraphs 1-7, wherein the first portion of the first layer comprises a first plurality of trenches, and at least one of the first plurality of trenches makes an angle of about 15° to about 75° with respect to a surface of the first layer.

9. The method according to any one of paragraphs 1-8, wherein the curing process is selected from a group consisting of a thermal curing process, an ultraviolet curing process, a plasma-assisted treatment process, an ion beam treatment process, an e-beam treatment, a baking treatment, and any combination thereof.

10. The method according to any one of paragraphs 1-9, wherein the second layer is exposed to ozone during the curing process.

11. The method according to any one of paragraphs 1-10, further comprising removing residual material from the first portion of the first layer during an etching process subsequent to removing the mask.

12. The method according to any one of paragraphs 1-11, wherein the mask and the first portion of the second layer are removed during the same process.

13. The method according to any one of paragraphs 1-12, wherein the first portion of the second layer is removed by an etching process.

14. The method according to any one of paragraphs 1-13, further comprising curing the second layer with a curing process before the applying the mask on the second layer.

15. The method according to any one of paragraphs 1-14, subsequent to removing the mask, further comprising removing residual material from the first portion of the first layer during an etching process.

16. The method according to any one of paragraphs 1-15, wherein the etching process is a wet etch process and includes exposing the residual material to a solution comprising hydrofluoric acid, phosphoric acid, a hydroxide, or salts thereof.

17. The method according to any one of paragraphs 1-16, wherein the etching process is a dry etch process and includes exposing the residual material to plasma comprising fluorine, chlorine, compounds thereof, ions thereof, or any combination thereof.

18. The method according to any one of paragraphs 1-17, further comprising curing the second layer during a thermal curing process, an ultraviolet curing process, a plasma-assisted treatment process, an ion beam treatment process, an e-beam treatment, or any combination thereof.

19. The method according to any one of paragraphs 1-18, wherein the second layer is exposed to ozone during the curing process.

20. The method according to any one of paragraphs 1-19, wherein the first layer comprises one or more structures formed therein.

21. The method according to any one of paragraphs 1-20, wherein the one or more structures comprise vertical fins, slanted fins, or pillars.

22. The method according to any one of paragraphs 1-21, wherein the one or more structures are in the second portion of the first layer.

23. The method according to any one of paragraphs 1-22, wherein the second layer is deposited within spaces between the one or more structures.

24. The method according to any one of paragraphs 1-23, wherein the second layer is deposited by chemical vapor deposition, atomic layer deposition, physical vapor deposition, ion beam deposition, spin-coating, or any combination thereof.

25. The method according to any one of paragraphs 1-24, wherein the second layer comprises silicon oxide, silicon oxynitride, silicon nitride, silicon oxycarbide, amorphous silicon, polysilicon, alloys thereof, dopant derivatives thereof, or any combination thereof.

26. The method according to any one of paragraphs 1-25, wherein the mask comprises a contact mask, a proximity mask, a projection mask, or dicing tape.

27. The method according to any one of paragraphs 1-26, wherein the mask has a thickness of about 10 µm to less than 1 mm.

28. The method according to any one of paragraphs 1-27, wherein the mask has a thickness of about 50 µm to about 900 µm.

29. The method according to any one of paragraphs 1-28, wherein the mask has a thickness of about 100 µm to about 500 µm.

30. The method according to any one of paragraphs 1-29, wherein the first layer is a surface of the substrate.

31. The method according to any one of paragraphs 1-30, wherein the mask is removed before removing and the first portion of the second layer.

32. The method according to any one of paragraphs 1-31, wherein the mask and the first portion of the second layer are removed during the same process.

33. The method according to any one of paragraphs 1-32, wherein the first portion of the second layer is removed by an etching process.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:
1. A method for processing a workpiece, comprising:
depositing a second layer comprising an uncured composition directly on a first layer disposed on a substrate;

applying a mask directly on the second layer, wherein the mask covers a first portion of the second layer and leaves exposed a second portion of the second layer, wherein a first portion of the first layer is disposed below the first portion of the second layer and a second portion of the first layer is disposed below the second portion of the second layer, and wherein the first portion of the first layer comprises a first plurality of trenches;

exposing the mask and the second portion of the second layer to a curing process, wherein the mask shields the first portion of the second layer from the curing process while the second portion of the second layer is at least partially cured during the curing process, and wherein subsequent to the curing process, the first portion of the second layer comprises the uncured composition and the second portion of the second layer comprises a cured composition formed from the uncured composition; and removing the mask and the first portion of the second layer comprising the uncured composition.

2. The method of claim 1, wherein the at least one of the first plurality of trenches makes an angle of about 15° to about 75° with respect to a surface of the first layer.

3. The method of claim 1, wherein the second portion of the first layer comprises a second plurality of trenches, and at least one of the second plurality of trenches makes an angle of about 15° to about 75° with respect to a surface of the first layer.

4. The method of claim 3, wherein the first portion of the first layer comprises a first plurality of trenches, and at least one of the first plurality of trenches makes an angle of about 15° to about 75° with respect to a surface of the first layer.

5. The method of claim 1, wherein the mask and the first portion of the second layer are removed during the same process.

6. The method of claim 1, wherein the first portion of the second layer is removed by an etching process.

7. The method of claim 1, wherein the curing process is selected from a group consisting of a thermal curing process, an ultraviolet curing process, a plasma-assisted treatment process, an ion beam treatment process, an e-beam treatment, a baking treatment, and any combination thereof.

8. A method for processing a workpiece, comprising:
depositing a second layer comprising an uncured composition directly on a first layer disposed on a substrate, wherein a first portion of the first layer comprises a first plurality of trenches;
applying a mask directly on the second layer, wherein the mask covers a first portion of the second layer and leaves exposed a second portion of the second layer;
exposing the mask and the second portion of the second layer to a curing process, wherein the mask shields the first portion of the second layer from the curing process while the second portion of the second layer is at least partially cured during the curing process, and wherein subsequent to the curing process, the first portion of the second layer comprises the uncured composition and the second portion of the second layer comprises a cured composition formed from the uncured composition; and
removing the mask and the first portion of the second layer comprising the uncured composition during the same process.

9. The method of claim 8, wherein the first portion of the first layer is disposed below the first portion of the second layer and a second portion of the first layer is disposed below the second portion of the second layer, and wherein the first portion of the first layer comprises a first plurality of trenches, and at least one of the first plurality of trenches makes an angle of about 15° to about 75° with respect to a surface of the first layer.

10. The method of claim 8, wherein the first portion of the first layer is disposed below the first portion of the second layer and a second portion of the first layer is disposed below the second portion of the second layer, and wherein the second portion of the first layer comprises a second plurality of trenches, and at least one of the second plurality of trenches makes an angle of about 15° to about 75° with respect to a surface of the first layer.

11. The method of claim 10, wherein the first portion of the first layer comprises a first plurality of trenches, and at least one of the first plurality of trenches makes an angle of about 15° to about 75° with respect to a surface of the first layer.

12. The method of claim 8, wherein the first portion of the second layer is removed by an etching process.

13. The method of claim 8, wherein the curing process is selected from a group consisting of a thermal curing process, a plasma-assisted treatment process, an ion beam treatment process, an e-beam treatment, a baking treatment, and any combination thereof.

14. A method for processing a workpiece, comprising:
depositing a second layer comprising an uncured composition directly on a first layer disposed on a substrate, wherein a first portion of the first layer comprises a first plurality of trenches;
applying a mask directly on the second layer, wherein the mask covers a first portion of the second layer and leaves exposed a second portion of the second layer;
exposing the mask and the second portion of the second layer to a curing process, wherein the mask shields the first portion of the second layer from the curing process while the second portion of the second layer is at least partially cured during the curing process, and wherein subsequent to the curing process, the first portion of the second layer comprises the uncured composition and the second portion of the second layer comprises a cured composition formed from the uncured composition; and
removing the mask and the first portion of the second layer comprising the uncured composition, wherein the first portion of the second layer is removed by an etching process.

15. The method of claim 14, wherein the first portion of the first layer is disposed below the first portion of the second layer and a second portion of the first layer is disposed below the second portion of the second layer, and wherein the first portion of the first layer comprises a first plurality of trenches, and at least one of the first plurality of trenches makes an angle of about 15° to about 75° with respect to a surface of the first layer.

16. The method of claim 14, wherein the first portion of the first layer is disposed below the first portion of the second layer and a second portion of the first layer is disposed below the second portion of the second layer, and wherein the second portion of the first layer comprises a second plurality of trenches, and at least one of the second plurality of trenches makes an angle of about 15° to about 75° with respect to a surface of the first layer.

17. The method of claim 16, wherein the first portion of the first layer comprises a first plurality of trenches, and at least one of the first plurality of trenches makes an angle of about 15° to about 75° with respect to a surface of the first layer.

18. The method of claim 14, wherein the mask and the first portion of the second layer are removed during the same process.

19. The method of claim 14, wherein the curing process is selected from a group consisting of a thermal curing process, a plasma-assisted treatment process, an ion beam treatment process, an e-beam treatment, a baking treatment, and any combination thereof.

* * * * *